(12) United States Patent
Palacios et al.

(10) Patent No.: US 9,337,301 B2
(45) Date of Patent: May 10, 2016

(54) ALUMINUM NITRIDE BASED SEMICONDUCTOR DEVICES

(71) Applicant: Massachusetts Institute of Technology, Cambridge, MA (US)

(72) Inventors: Tomas Apostol Palacios, Belmont, MA (US); Tatsuya Fujishima, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/367,385

(22) PCT Filed: Dec. 21, 2012

(86) PCT No.: PCT/US2012/071342
§ 371 (c)(1),
(2) Date: Jun. 20, 2014

(87) PCT Pub. No.: WO2013/096821
PCT Pub. Date: Jun. 27, 2013

(65) Prior Publication Data
US 2015/0028346 A1    Jan. 29, 2015

Related U.S. Application Data

(60) Provisional application No. 61/578,720, filed on Dec. 21, 2011.

(51) Int. Cl.
| | | |
|---|---|---|
| H01L 29/66 | (2006.01) | |
| H01L 29/778 | (2006.01) | |
| H01L 29/201 | (2006.01) | |
| H01L 29/812 | (2006.01) | |
| H01L 29/20 | (2006.01) | |
| H01L 29/205 | (2006.01) | |

(52) U.S. Cl.
CPC ........ *H01L 29/66462* (2013.01); *H01L 29/201* (2013.01); *H01L 29/2003* (2013.01); *H01L 29/205* (2013.01); *H01L 29/778* (2013.01); *H01L 29/7783* (2013.01); *H01L 29/7787* (2013.01); *H01L 29/812* (2013.01)

(58) Field of Classification Search
CPC .................. H01L 29/66431; H01L 29/66462; H01L 29/778; H01L 2924/13064; H01L 29/7783; H01L 29/7784; H01L 29/7785
See application file for complete search history.

(56) References Cited

U.S. PATENT DOCUMENTS

| | | | | |
|---|---|---|---|---|
| 4,914,488 A | * | 4/1990 | Yamane et al. | 257/17 |
| 5,670,798 A | * | 9/1997 | Schetzina | 257/96 |
| 5,786,244 A | * | 7/1998 | Chang | H01L 29/7785 257/194 |

(Continued)

OTHER PUBLICATIONS

International Search Report and Written Opinion from corresponding PCT Application No. PCT/US2012/071342 dated Apr. 23, 2013.

(Continued)

*Primary Examiner* — Eduardo A Rodela
(74) *Attorney, Agent, or Firm* — Wolf, Greenfield & Sacks, P.C.

(57) ABSTRACT

Semiconductor structures and techniques are described which enable forming aluminum nitride (AlN) based devices by confining carriers in a region of AlN by exploiting the polar nature of AlN materials. Embodiments of AlN transistors utilizing polarization-based carrier confinement are described.

16 Claims, 11 Drawing Sheets

(56) References Cited

U.S. PATENT DOCUMENTS

| | | | |
|---|---|---|---|
| 6,160,274 A * | 12/2000 | Folkes | 257/191 |
| 7,525,130 B2 | 4/2009 | Mishra et al. | |
| 7,700,973 B2 * | 4/2010 | Shen et al. | 257/194 |
| 7,915,643 B2 | 3/2011 | Suh et al. | |
| 8,344,356 B2 * | 1/2013 | Sakamoto et al. | 257/22 |
| 8,633,518 B2 * | 1/2014 | Suh et al. | 257/194 |
| 8,816,396 B2 * | 8/2014 | Hwang | H01L 29/66462 257/194 |
| 2003/0218183 A1 * | 11/2003 | Micovic et al. | 257/192 |
| 2004/0061129 A1 | 4/2004 | Saxler et al. | |
| 2005/0118752 A1 * | 6/2005 | Otsuka et al. | 438/172 |
| 2005/0133816 A1 * | 6/2005 | Fan | H01L 29/7783 257/190 |
| 2006/0118824 A1 | 6/2006 | Otsuka et al. | |
| 2006/0138457 A1 | 6/2006 | Otsuka et al. | |
| 2006/0231860 A1 | 10/2006 | Mishra et al. | |
| 2007/0272945 A1 | 11/2007 | Matsuo et al. | |
| 2008/0203430 A1 | 8/2008 | Simin et al. | |
| 2009/0042345 A1 | 2/2009 | Saxler et al. | |
| 2010/0084688 A1 | 4/2010 | Lu et al. | |
| 2010/0187569 A1 | 7/2010 | Renaud et al. | |
| 2011/0001127 A1 * | 1/2011 | Sakamoto | H01L 21/02381 257/22 |
| 2011/0193619 A1 * | 8/2011 | Parikh et al. | 327/534 |
| 2011/0278647 A1 * | 11/2011 | Hashimoto | H01L 29/7787 257/194 |
| 2012/0098599 A1 | 4/2012 | Chang et al. | |
| 2013/0062621 A1 * | 3/2013 | Fichtenbaum | H01L 29/66462 257/77 |

OTHER PUBLICATIONS

E. Pokatilov et al. Confined electron-confined phonon scattering rates in wurtzite AlN/GaN/AlN heterostructures, Journal of Applied Physics, vol. 95, No. 10, May 15, 2004.

S. Rajan et al. AlGaN/GaN polarization-doped field-effect transistor for microwave power applications, Appl. Phys. Lett. 84, 1591 (2004).

Y. Taniyasu et al. Intentional control of n-type conduction for Si-doped AlN and AlXGa1—XN (0.42x<1), Appl. Phys. Lett. 81, 1255 (2002).

* cited by examiner

| Material | Bandgap (eV) | $\varepsilon_r$ | Mobility (cm²/Vs) | Breakdown Electric field (MV/cm) | Saturation velocity (10⁷cm/s) | Thermal conductivity (W/cm·K) |
|---|---|---|---|---|---|---|
| GaN | 3.4 | 9.0 | 900 2DEG:1200-1600 | 3.3 | 2.5 | 1.3 |
| AlN | 6.2 | 8.5 | 300 | 11.7 | 2.0 | 3.4 |
| InN | 0.6~0.7 | 15.0 | 14000 | 2.0 | 6.0 | 0.8 |
| Si | 1.1 | 11.8 | 1500 | 0.3 | 1.0 | 1.5 |
| GaAs | 1.4 | 12.8 | 8500 | 0.4 | 2.0 | 0.5 |
| 6H–SiC | 3.0 | 9.7 | 460 | 2.4 | 2.0 | 4.5 |
| Diamond | 5.5 | 5.5 | 1800 | 4.0 | 2.5 | 20.9 |

*FIG. 2A*

○ Aluminum, Gallium, or Indium atom o Nitrogen atom

Group III-polarity
[0001]

N-polarity
[000-1]

US 9,337,301 B2

ALUMINUM NITRIDE BASED SEMICONDUCTOR DEVICES

CROSS-REFERENCE TO RELATED APPLICATIONS

This application is a U.S. National Stage Application of International Application PCT/US2012/071342 filed Dec. 21, 2012 and claims priority under 35 U.S.C. 119(e) to U.S. provisional application 61/578,720, filed Dec. 21, 2011, titled "STRUCTURE AND TECHNOLOGY FOR POWER SEMICONDUCTOR DEVICES," each of which is hereby incorporated by reference in its entirety.

STATEMENT REGARDING FEDERALLY SPONSORED RESEARCH OR DEVELOPMENT

This invention was made with government support under Grant No. N00014-09-1-0864 awarded by the US Office of Naval Research and under Contract No. FA8721-05-C-0002 awarded by the US Air Force. The government has certain rights in this invention.

BACKGROUND

1. Field of Invention

The techniques and apparatus described herein relate to semiconductor structures and devices, and particularly to aluminum nitride based semiconductor structures and devices.

2. Discussion of the Related Art

Improved power transistors are desired for advanced transportation systems, more robust energy delivery networks and new approaches to high-efficiency electricity generation and conversion. Such systems rely on very efficient converters to step-up or step-down electric voltages, and use power transistors capable of blocking large voltages.

Nitride semiconductor devices have been proposed as offering the potential for producing high-efficiency power electronics demanding high blocking voltages and low on-resistances. One nitride-based semiconductor material that has been investigated is gallium nitride (GaN). A GaN-based HEMT (High Electron Mobility Transistor) can be formed by confining carriers in a two-dimensional electron gas (2DEG). Carrier confinement is conventionally achieved by forming a material with a higher bandgap on a material of lower bandgap. GaN-based HEMT devices have been formed using a layer of GaN with an overlying layer of aluminum gallium nitride (AlGaN) of a higher bandgap than GaN.

FIG. 1 shows an example of a conventional HEMT 10 formed of GaN and AlGaN semiconductor layers 2, 4, respectively. As shown in FIG. 1, the HEMT 10 is formed on a substrate 6 of a material such as silicon carbide (SiC), silicon (Si) or sapphire, for example. Due to the lattice mismatch between the substrate and a III-V semiconductor material such as GaN, on top of the substrate is formed a buffer layer 8 typically having a graded composition such that the lattice constant changes gradually from its lower surface to its upper surface. At its upper surface, the buffer layer 8 has a higher lattice constant than at its lower surface to accommodate the lattice constant of GaN. As shown in FIG. 1, a GaN layer 2 is formed on the buffer layer 8. A layer of AlGaN 4 is formed on top of the GaN layer 2. Since the bandgap of AlGaN is higher than that of GaN, a two-dimensional electron gas 9 is formed in the GaN layer 2 at the interface between the GaN and AlGaN layers 2, 4. Source and drain contacts S, D as well as a gate G and passivation layer 11 are formed over the AlGaN layers. In operation, a voltage applied to the gate modulates the two-dimensional electron gas 9, which acts as a channel region of the transistor.

SUMMARY

Some embodiments relate to an electronic semiconductor device comprising: a first semiconductor region comprising a III-N semiconductor material including aluminum and nitrogen, wherein the proportion of aluminum as a group III element of the III-N semiconductor material is greater than or equal to 50%; a second semiconductor region comprising a III-N semiconductor material including aluminum and nitrogen, wherein the proportion of aluminum as a group III element of the III-N semiconductor material is greater than or equal to 50%; and a third semiconductor region having a bandgap lower than that of the first semiconductor region, the third semiconductor region being formed between the first semiconductor region and the second semiconductor region, wherein charge carriers are confined in the first semiconductor region or the second semiconductor region.

Some embodiments relate to an electronic semiconductor device, comprising: a first semiconductor region comprising AlN; and a second semiconductor region having a graded composition, the graded composition being graded from AlN to a III-N semiconductor material comprising a first group III element and at least one second group III element, wherein the first group III element is aluminum.

Some embodiments relate to an electronic semiconductor device, comprising: a semiconductor region having a graded composition, the graded composition being graded from a first composition of $B_{w1}Al_{x1}In_{y1}Ga_{z1}N$, wherein $w1+x1+y1+z1=1$, to a second composition of $B_{w2}Al_{x2}In_{y2}Ga_{z2}N$, wherein $w2+x2+y2+z2=1$, wherein $w1\geq0$, $w2\geq0$, $x1\geq0$, $x2\geq0$, $y1\geq0$, $y2\geq0$, $z1\geq0$, $z2\geq0$, and wherein $x2$ is greater than 0.3.

Some embodiments relate to a semiconductor electronic device, comprising: a semiconductor region comprising a group III-N semiconductor material in which charge carriers are confined, wherein the charge carriers are confined in a confinement region, and wherein, in the confinement region, the group III-N semiconductor material of the semiconductor region is formed of $B_wAl_xIn_yGa_zN$ in which x is no less than 0.5.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 2A shows a table of material properties for exemplary semiconductor materials including GaN and AlN.

DETAILED DESCRIPTION

Figure 1:
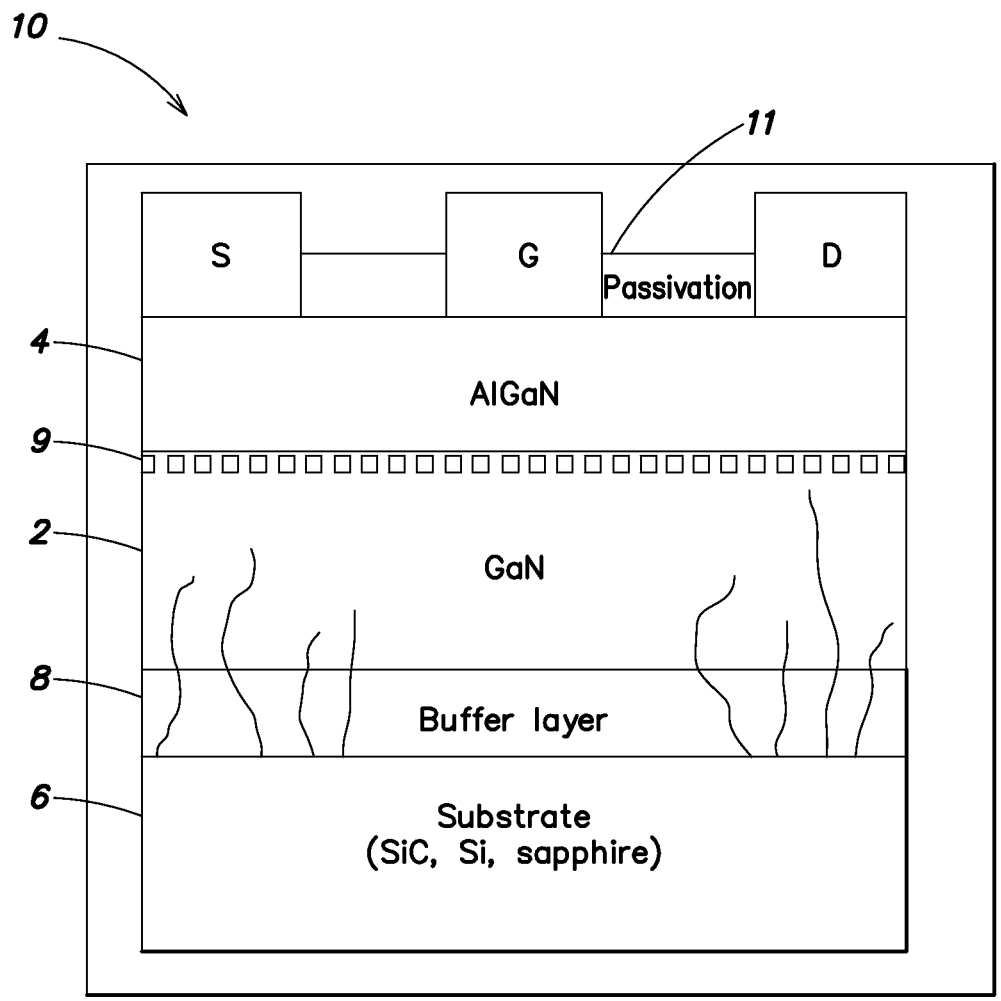
FIG. 1 shows a cross section of a conventional GaN HEMT.

The present inventors have appreciated several disadvantages of the conventional HEMT illustrated in FIG. 1. As an example, the use of a graded buffer layer to accommodate the lattice mismatch between a III-V semiconductor material and the underlying substrate in the HEMT of FIG. 1 may introduce a high concentration of threading dislocations which propagate to the overlying semiconductor layers and reduce performance. Other disadvantages are the relatively low thermal conductivity of GaN, which limits heat dissipation, and the relatively low critical electric field of GaN, which limits the breakdown voltage of the transistor.

Figure 2B:
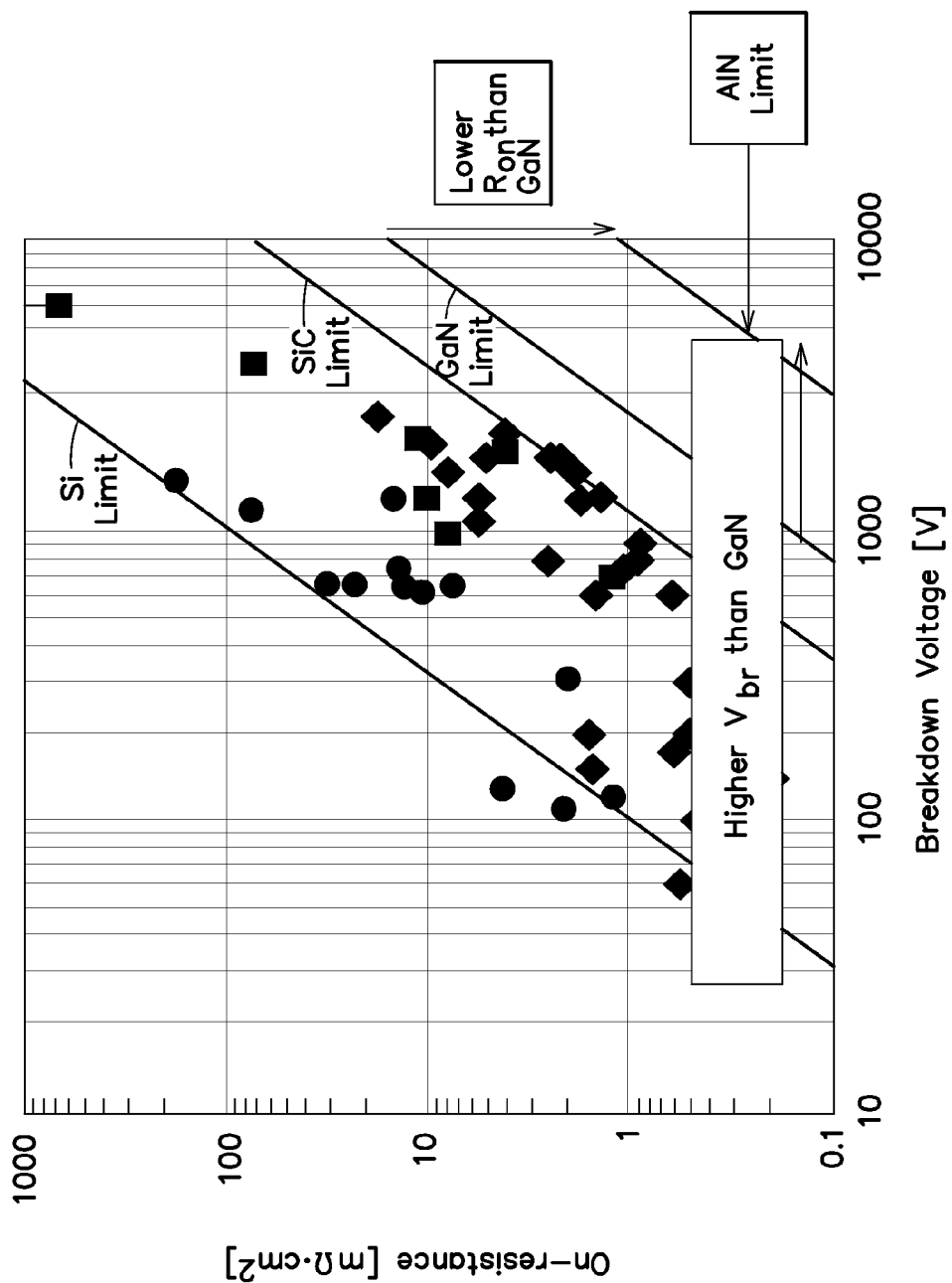
FIG. 2B shows a plot of the breakdown voltage and on-resistance that may be achieved for transistors formed using various semiconductor materials.

Aluminum nitride (AlN) has been proposed as a material for semiconductor devices due to its high critical electric field and high thermal conductivity. FIG. 2A shows a table of material properties for various semiconductor materials, including GaN and AlN, for example. As shown in FIG. 2A, the breakdown electric field and thermal conductivity of AlN are each several times higher than the breakdown electric field and thermal conductivity of GaN, respectively. FIG. 2B illustrates that transistors based on AN have the potential to exhibit higher breakdown voltages and lower on-resistances than transistors based on other semiconductor materials. However, the potential of AN transistors has yet to be realized due to the challenges of producing AlN-based devices. A HEMT having a structure as illustrated in FIG. 1 cannot be formed using AN due to the very high bandgap of AlN (6.2 eV), as no suitable higher-bandgap material exists which can be formed on AlN to produce the necessary carrier confinement. Even if such a confinement is achieved, it is very difficult to achieve good ohmic contacts in such a high bandgap material.

The present inventors have developed innovative semiconductor structures and techniques which enable forming aluminum nitride (AlN) based devices by confining carriers in a region of AlN-based semiconductor material by exploiting the polar nature of AlN materials. Embodiments of AlN transistors utilizing polarization-based carrier confinement are described herein.

Figure 3A:
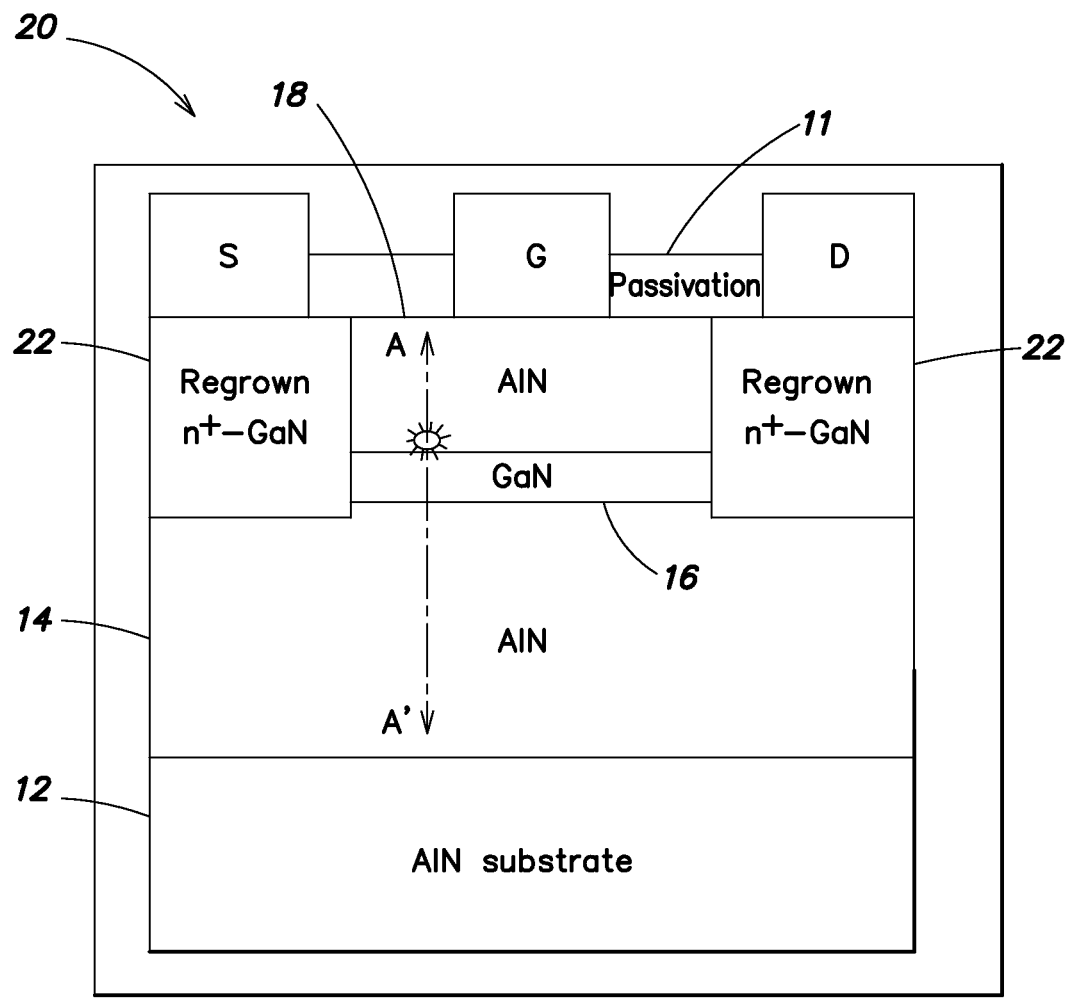
FIG. 3A shows a cross section of an AlN-based field effect transistor, according to some embodiments.

FIG. 3A shows a cross section of an AlN-based field effect transistor 20, according to some embodiments. In the example of FIG. 3A, the AlN-based field effect transistor 20 is an AlN/GaN/AlN dual heterostructure field effect transistor formed on an AlN substrate 12. As shown in FIG. 3A, a first semiconductor region 14 of AlN may be formed on the AlN substrate 12. An intermediate semiconductor region 16 of a second semiconductor material having a bandgap lower than that of AlN, such as GaN, for example, is formed on the first semiconductor region 14. As shown in FIG. 3A, another semiconductor region 18 of AlN may be formed on the intermediate semiconductor region 16. Semiconductor regions 14 and 18 may have any suitable thickness (with thickness being measured along the vertical dimension of FIG. 3A). In some embodiments, semiconductor region 14 may have a thickness of at least 5 nm or 10 nm. Semiconductor region 18 may have a thickness of between 1 nm and 200 nm, in some embodiments.

The intermediate region 16 may be a relatively thin layer. In some embodiments, the small thickness of layer 16 prevents the confinement of the electrical carriers in the quantum well formed by region 16, and carriers are expelled from intermediate region 16 into semiconductor region 14 or semiconductor region 18. Such a structure can enable confining carriers in semiconductor 14 or semiconductor region 18 due to the polar nature of AlN, which induces an electric field (sloped conduction band) in the intermediate region 16, as discussed further in connection with FIGS. 3B, 3C and 3D. In some embodiments, the thickness of intermediate region 16 may be less than 20 nm, such as 10 nm or less or 5 nm or less. In some embodiments, the thickness of intermediate region 16 may be between 1 nm and 5 nm. In some embodiments, the carriers may be provided by defects, traps, or doped regions in the semiconductor structure.

Figure 3B:
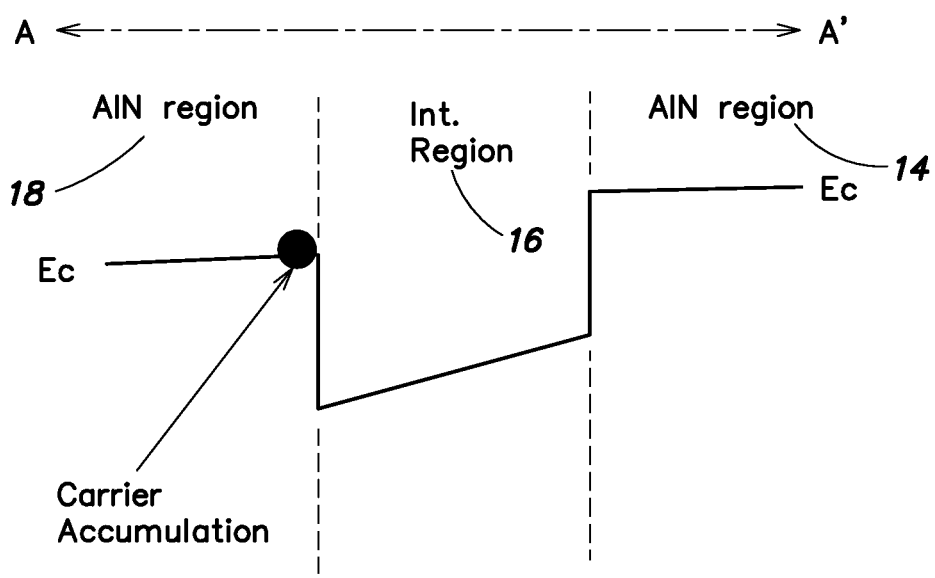
FIG. 3B shows the conduction band of the semiconductor material along the vertical direction in the field effect transistor illustrated in FIG. 3A.

FIG. 3B shows a diagram of the conduction band across the layers of the field effect transistor 20 along the line A-A' of FIG. 3A. Since AlN is a polar material, the difference in polarization between semiconductor region 14 and semiconductor region 16 induces an electric field inside semiconductor region 16 which shifts the conduction band between the semiconductor region 14 and the semiconductor region 18. Due to the large polarization difference that is possible between semiconductor region 14 and semiconductor region 16, the polarization induced electric field in semiconductor region 16 may be very large, which enables large shifts in the conduction band for a relatively small thickness of the intermediate semiconductor region 16. As illustrated in FIG. 3B, the electric field in the intermediate semiconductor region 16 and its small thickness causes carriers to accumulate in the semiconductor region 18 near the interface between the semiconductor region 18 and the intermediate semiconductor region 16. As a result, a two-dimensional electron gas can be formed in the semiconductor region 18, producing an AlN-based field effect transistor. In this device, the channel carriers mainly feel the material properties of semiconductor region 18.

Figures 3C, 3D:
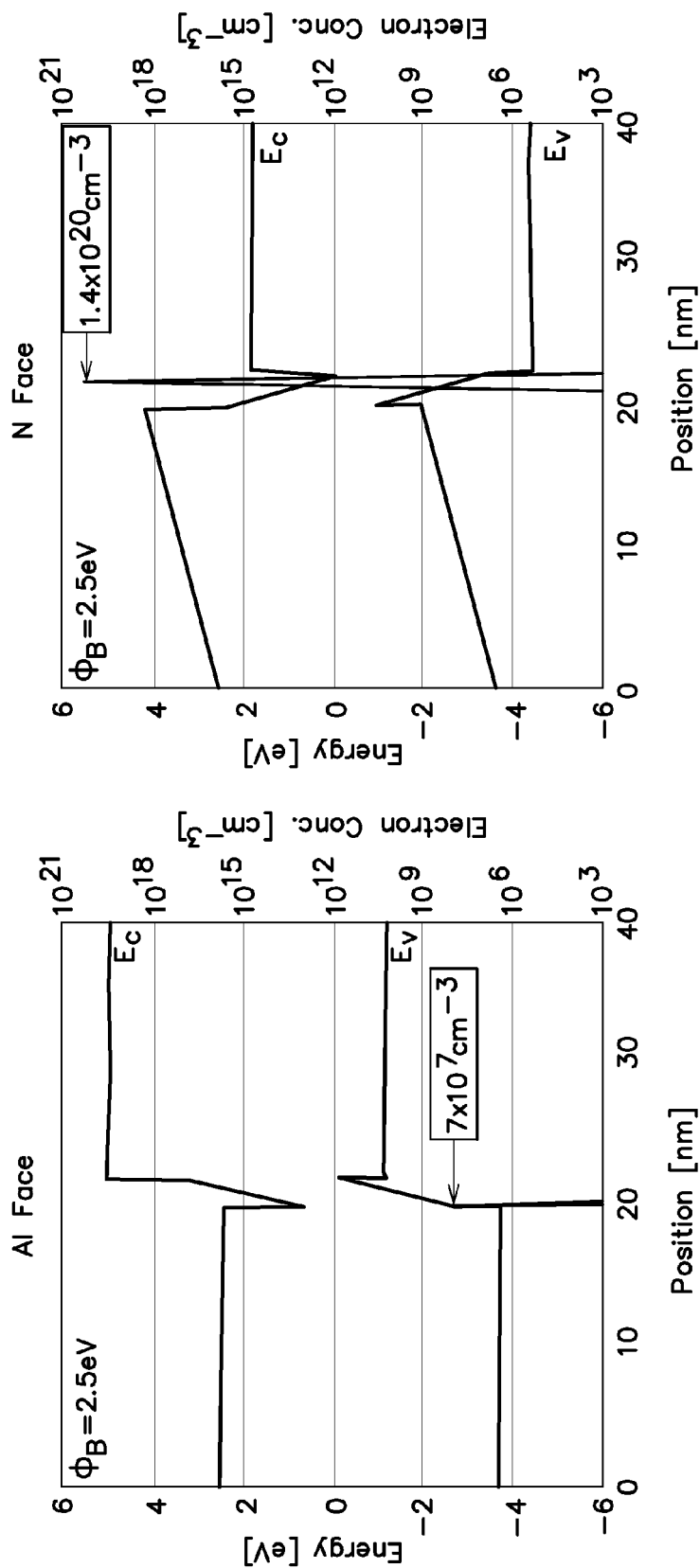
FIG. 3C shows a plot of the conduction band and valence band along the vertical direction in the field effect transistor illustrated in FIG. 3A when the FET is formed on an Al-face AlN substrate.
FIG. 3D shows a plot of the conduction band and valence band along the vertical direction in the field effect transistor illustrated in FIG. 3A when the FET is formed on an N-face AlN substrate.

The direction of the electric field in the intermediate semiconductor region 16 is dependent upon the direction of the polarization-induced dipole moment in the AlN-based semiconductor material. In the example of FIG. 3B, the substrate 12 is an AlN substrate that has Al-face crystal orientation on its upper surface (adjacent to semiconductor region 14). FIG. 3C shows another band diagram for the transistor of FIG. 3A having an Al-face AlN substrate. In addition to showing the conduction band, FIG. 3C also shows the valence band as well as the carrier concentration. As illustrated in FIG. 3C, a carrier concentration of $7 \times 10^7$ cm$^{-3}$ is produced in the semiconductor region 18 near the interface between the semiconductor region 18 and the intermediate semiconductor region 16.

Figure 3E:
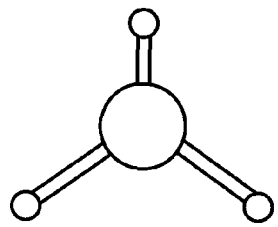
FIG. 3E shows the crystal structure for a semiconductor material having a group III element (e.g., Al, Ga or In) face or polarity on its upper surface (left) and the crystal structure for a semiconductor material having nitrogen face or polarity on its upper surface (right).
Figure 3E:
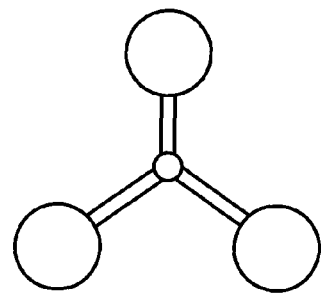
Figure 3E:
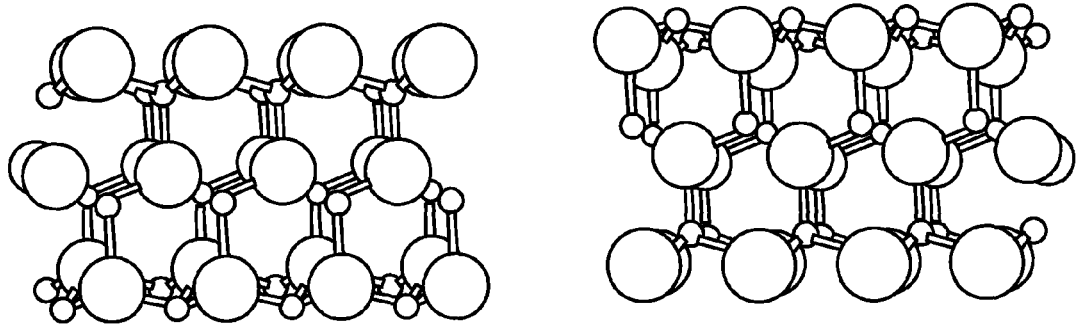

In some embodiments, the substrate 12 may be oriented with its dipole moment in the opposite direction, that is, with an N-face orientation of the upper surface of the substrate 12 (adjacent to semiconductor region 14). When the dipole moment is reversed, carrier confinement is produced in semiconductor region 14 below the intermediate semiconductor region 16. FIG. 3D shows a band diagram for the transistor of FIG. 3A having an N-face AlN substrate 12. FIG. 3D shows the conduction band, the valence band, as well as the carrier concentration. As illustrated in FIG. 3D, the conduction band slopes in the opposite direction as that shown in FIG. 3C, causing carrier confinement in the semiconductor region 14. As further shown in FIG. 3D, a carrier concentration of $1.4 \times 10^{20}$ cm$^{-3}$ is produced in the semiconductor region 14 near the interface between the semiconductor region 14 and the intermediate semiconductor region 16. Accordingly, an N-face substrate may be preferred for such a transistor due to the high concentration of carriers that may be produced. However, a substrate having any suitable polarity may be used. The polarity will also impact whether the accumulated carriers are electrons or holes. FIG. 3E shows the crystal structure [0001] for a semiconductor material having a group III polarity at its upper surface (left) and the crystal structure [000-1] for a semiconductor material having nitrogen polarity at its upper surface (right).

In some embodiments, a semiconductor structure as described herein causes carriers to be confined in a confinement region. In the embodiment of FIG. 3A, at least a portion of the confinement region is present in semiconductor region 18 or semiconductor region 14. In some embodiments, at least 50% of the charge carriers in the confinement region may be confined in semiconductor region 18 or semiconductor region 14. In some embodiments, higher carrier confinement can be achieved in semiconductor region 18 or semiconductor region 14, such that greater than 70% or greater than 90% of the charge carriers in the confinement region may be confined in semiconductor region 18 or semiconductor region 14. The confinement region may produce a channel region of an electronic semiconductor device that primarily is present within a region of AlN-based semiconductor material.

FIG. 3A also shows a technique and structure for making contact to the channel region of the field effect transistor 20. Following the formation of the intermediate semiconductor region 16 and the semiconductor region 18, regions of the intermediate semiconductor region 16 and the semiconductor region 18 may be etched in a region in which source and drain contacts are to be formed. In the etched regions, regions of semiconductor material 22 may be formed to provide a good ohmic contact to the channel region in which carriers are confined. The regions of semiconductor material 22 may be regions of regrown semiconductor material. Regions of semiconductor material 22 may be formed of a III-N material such as GaN or InGaN, for example. In some embodiments, regions 22 may be formed of InN or any other heavily doped semiconductor that allows good contact to the channel of the transistor. In some embodiments, the regions 22 may be formed of the same material as the intermediate semiconductor region 16. Regions 22 may be highly doped (e.g., n+ doped). In some embodiments, regions 22 may have a graded composition to increase the concentration of carriers therein. Source and drain contacts S, D may be formed on the semiconductor regions 22, and a gate G and passivation layer 11 may be formed.

As shown in FIG. 3A, the intermediate region 16 may be formed of GaN.

However, the techniques described herein are not limited in this respect, as intermediate region 16 may be formed of any suitable material. For example, intermediate region 16 may be formed of another group III-N semiconductor material. The material forming intermediate region 16 may have a lattice constant similar to that of AlN to avoid lattice mismatch. In some embodiments, the intermediate region 16 may include a III-N semiconductor material (e.g., $B_w In_x Al_y Ga_{1-w-x-y} N$ having any suitable composition, where w, x and y are each greater than or equal to zero) having a bandgap lower than that of the AlN regions 14, 18.

As shown in FIG. 3A, semiconductor regions 14 and 18 may be formed of AlN. However, the techniques described herein are not limited in this respect, as semiconductor regions 14 and 18 may be formed of another III-N semiconductor material having a high proportion of aluminum as a group III element. For example, semiconductor regions 14 and 18 may be formed of a group III-N semiconductor material that includes aluminum and nitrogen (e.g., $B_w In_x Al_y Ga_z N$, where w, x and/or z may be between zero and one, inclusive, and w+x+y+z=1), and in which the proportion of aluminum as the group III element of the III-N semiconductor material is at least 50%, at least 70%, at least 90% or approximately 100%.

FIG. 3A shows an embodiment in which semiconductor region 14 is formed on a substrate. However, in some embodiments, semiconductor region 14 may be the substrate (e.g., a semiconductor wafer) on which the remaining layers of the semiconductor device are formed. For example, when semiconductor region 14 is formed of AlN, semiconductor region 14 may be an AlN substrate.

Figure 3F:
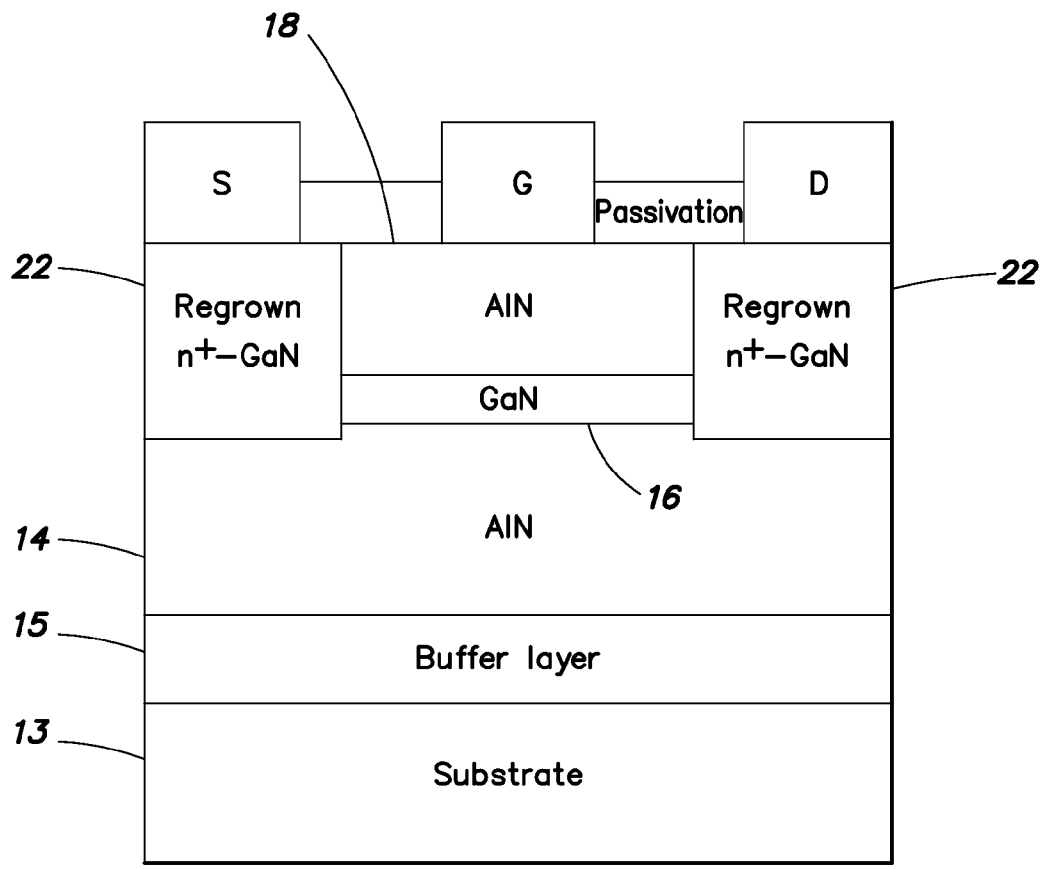
FIG. 3F shows a cross section of an AlN-based field effect transistor formed over a substrate having a lattice constant different from that of relaxed AlN, according to some embodiments.

FIG. 3F shows another embodiment in which the field effect transistor of FIG. 3A may be formed on a different substrate. For example, the field effect transistor may be formed on a substrate 13 having a lattice constant different from that of relaxed AlN. Substrate 13 may be formed of any suitable material, such as GaN, Si, etc. In some embodiments, a buffer layer 15 may be formed on the substrate 13 and the semiconductor region 14 may be formed on the buffer layer 15. Buffer layer 15 may have a graded composition to accommodate the lattice mismatch between substrate 13 and semiconductor region 14.

Figure 4A:
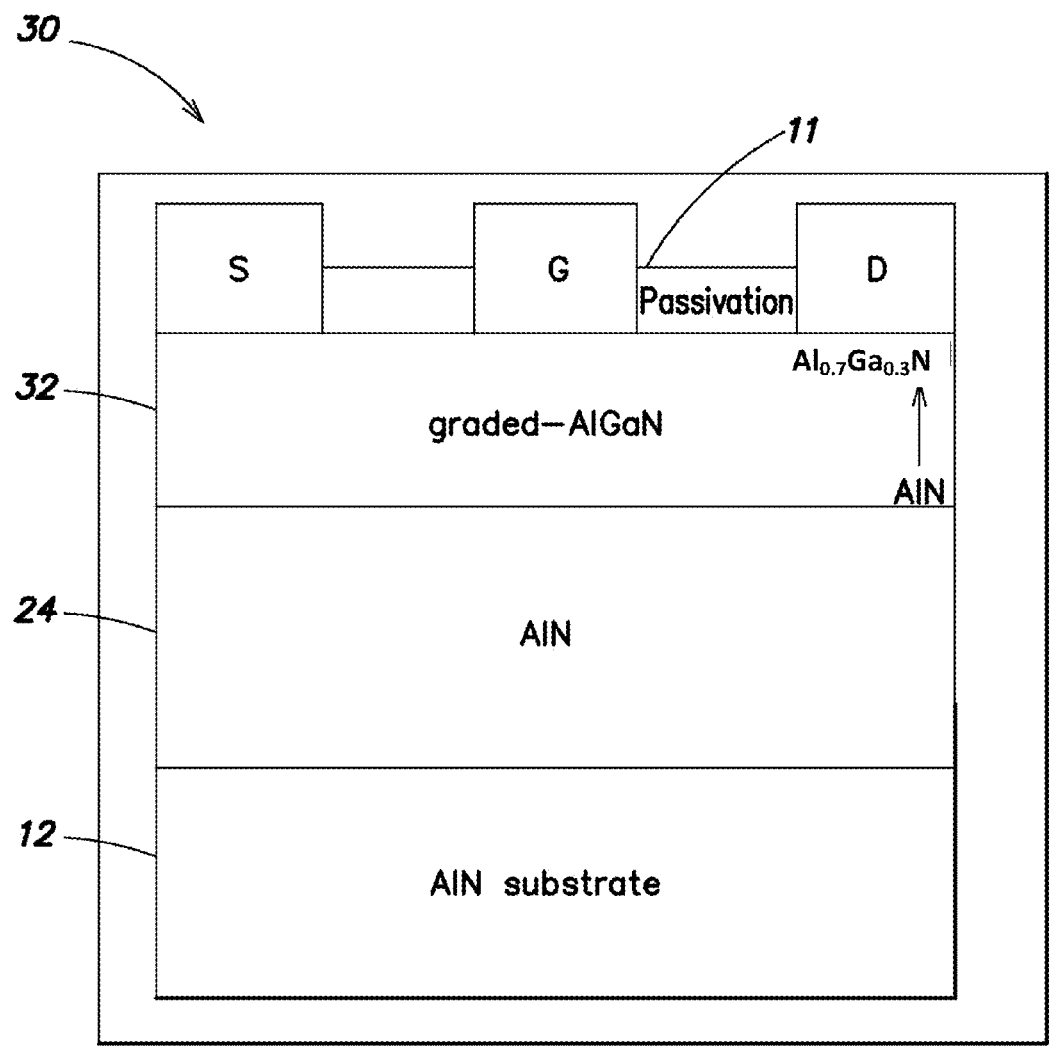
FIG. 4A shows a cross section of another embodiment of an AlN-based transistor in which a graded composition of semiconductor produces carrier confinement due to a polarization doping effect.

FIG. 4A shows a cross section of another embodiment of an AlN-based field effect transistor having a graded composition of an AlN semiconductor material. According to some embodiments, forming a graded composition of AlN semiconductor material produces carrier confinement due to a polarization doping effect. As illustrated in FIG. 4A, a semiconductor region 24 may be formed on a substrate 12. In the embodiment of FIG. 4A, semiconductor region 24 is formed of AlN and substrate 12 is formed of AlN. On the semiconductor region 24 may be formed a graded semiconductor region 32. Graded semiconductor region 32 may have a composition that changes through its thickness. In the example of FIG. 4A, the lower surface of the graded semiconductor region 32 may be formed of AlN and the remaining portion of the graded semiconductor region 32 may be formed of $B_w In_x Al_y Ga_{1-w-x-y} N$. In the embodiment of FIG. 4A, the composition of the graded semiconductor region 32 changes with increasing distance from AlN layer 24 such that an increasing proportion of Ga and a decreasing proportion of Al is present. For example, the composition of the graded semiconductor region 32 may be graded from AlN to $Al_{0.7}Ga_{0.3}N$, as shown in FIG. 4A. The proportion of aluminum as the group III element of the III-V semiconductor material thus varies between 100% and 70%. In some embodiments, the mobile carriers may be provided by material defects, the semiconductor surface or doped layers, or any combination thereof. However, the techniques described herein are not limited in this respect, as the mobile carriers may be provided by any suitable source.

Figure 4B:
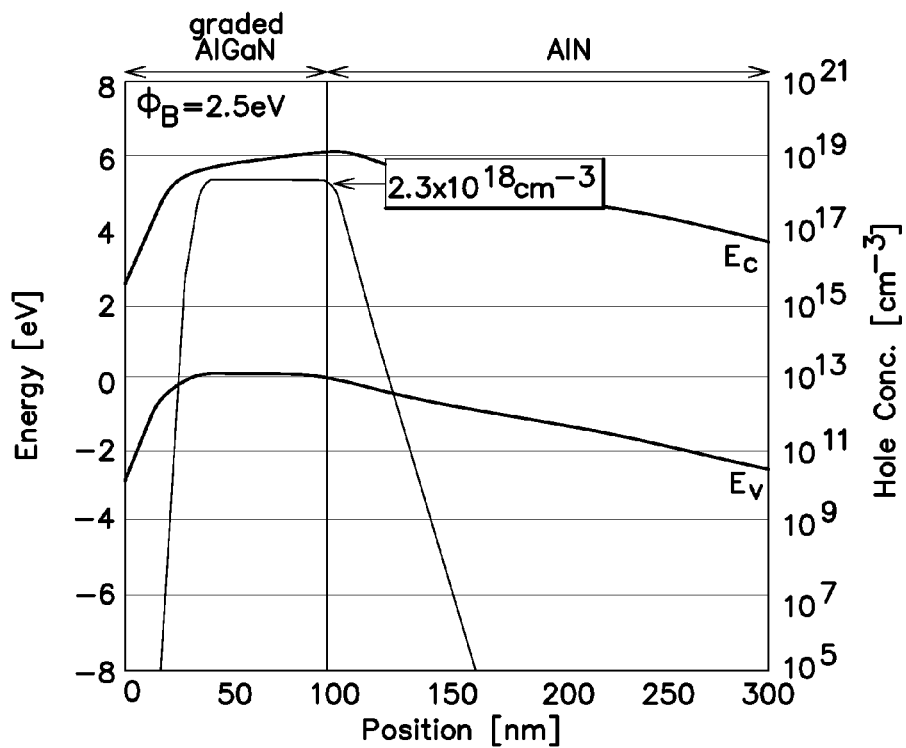
FIG. 4B shows a plot of the conduction band and valence band along the vertical direction in the field effect transistor illustrated in FIG. 4A when the FET is formed on an Al-face AlN substrate.
Figure 4C:
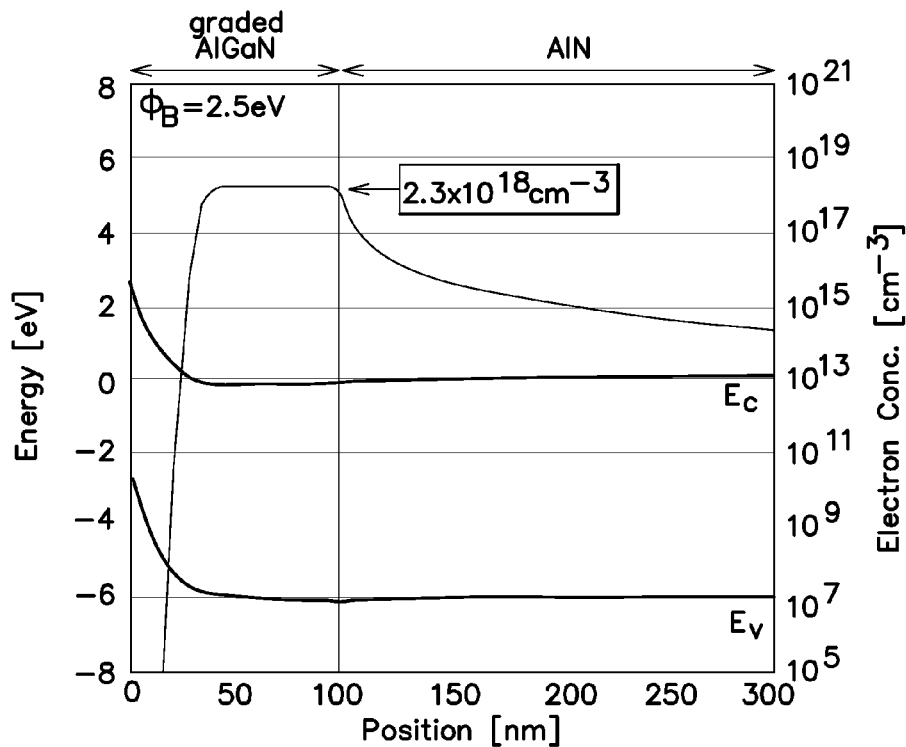
FIG. 4C shows a plot of the conduction band and valence band along the vertical direction in the field effect transistor illustrated in FIG. 4A when the FET is formed on an N-face AlN substrate.

The grading in composition of the graded semiconductor region 32 produces carrier confinement in the graded semiconductor region 32 due to the polarization gradient that is produced therein. Accordingly, a three-dimensional electron (or hole) gas can be produced in the graded semiconductor region 32 that may be used as the channel of an AlN-based transistor. FIG. 4B shows a diagram of the conduction band, the valence band, and the carrier concentration in the transistor of FIG. 4A when an Al-face AlN substrate is used. As shown in FIG. 4B, a three-dimensional hole gas is produced in the graded semiconductor region 32 having a carrier concentration of $2.3 \times 10^{18}$ $cm^{-3}$. FIG. 4C shows a diagram of the conduction band, the valence band, and the carrier concentration in the transistor of FIG. 4A when a nitrogen-face AlN substrate is used. As shown in FIG. 4C, a three-dimensional electron gas is produced in the graded semiconductor region 32 having a carrier concentration of $2.3 \times 10^{18}$ $cm^{-3}$. To provide the carriers for these channels, any of the layers may be doped n-type or p-type. Semiconductor region 32 may have any suitable thickness, such as between 2 nm and 200 nm, for example.

In general, the composition of the graded semiconductor region 32 is graded from a first composition of $B_{w1}Al_{x1}In_{y1}Ga_{z1}N$, where $w1+x1+y1+z1=1$, to a second composition of $B_{w2}Al_{x2}In_{y2}Ga_{z2}N$, where $w2+x2+y2+z2=1$, and $w1 \geq 0$, $w2 \geq 0$, $x1 \geq 0$, $x2 \geq 0$, $y1 \geq 0$, $y2 \geq 0$, $z1 \geq 0$, $z2 \geq 0$. In some embodiments, the minimum proportion of aluminum as the group III element in a region in which carriers are confined may be greater than 30%, greater than 50%, or greater than 70%, for example. The remaining proportion of group III element may be any one or a combination of group III elements such as boron, gallium and/or indium.

FIG. 4A shows an embodiment in which a semiconductor region 24 is formed on a substrate 12. However, in some embodiments, semiconductor region 24 may be the substrate (e.g., a semiconductor wafer) on which the remaining layers of the semiconductor device are formed. For example, when semiconductor region 24 is formed of AlN, semiconductor region 24 may be an AlN substrate.

Figure 4D:
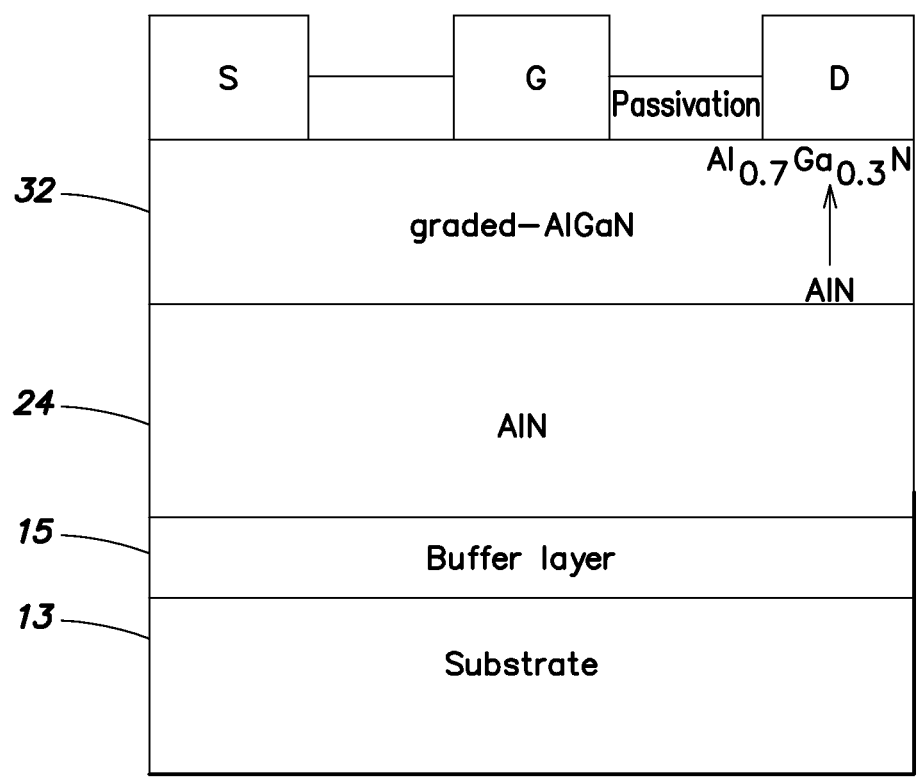
FIG. 4D shows a cross section of another embodiment of an AlN-based transistor in which a region of graded composition is formed over a substrate having a lattice constant different from that of relaxed AlN, according to some embodiments.

FIG. 4D shows an embodiment in which the transistor of FIG. 4A may be formed on a different substrate. For example, the field effect transistor may be formed on a substrate 13 having a lattice constant different from that of relaxed AlN. Substrate 13 may be formed of any suitable material, such as GaN, Si, SiC, sapphire, etc. In some embodiments, a buffer layer 15 may be formed on the substrate 13 and the semiconductor region 24 may be formed on the buffer layer 15. Buffer layer 15 may have a graded composition to accommodate the lattice mismatch between substrate 13 and semiconductor region 24.

The techniques described herein may be used to produce any suitable types of semiconductor devices such as transistors, diodes, capacitors, resistors, light emitting diodes, or other devices. Such devices may find various applications, such as power applications in which a device needs to be capable of withstanding high voltage and/or current.

As used herein, the term "doped" with respect to a semiconductor region is used to refer to a semiconductor region that is intentionally doped and has a doping concentration high enough such that the doping is not the result of impurities unintentionally introduced during device fabrication.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A semiconductor device, comprising:
   a first semiconductor region consisting essentially of AlN; and
   a second semiconductor region having a graded channel, the second semiconductor region having a graded composition, the graded composition being graded from a first side of the second semiconductor region having a first composition consisting essentially of AlN to a second side of the second semiconductor region having a composition of $B_wAl_xIn_yGa_zN$, wherein $w+x+y+z=1$, wherein w is greater than or equal to zero, x is greater than or equal to 0.3, y is greater than or equal to zero, and z is greater than or equal to 0.

2. The semiconductor device of claim 1, wherein the first semiconductor region comprises an AlN substrate or the first semiconductor region is formed over an AlN substrate.

3. The semiconductor device of claim 1, wherein x is greater than 0.5.

4. The semiconductor device of claim 3, wherein x is at least 0.7.

5. The semiconductor device of claim 1, wherein the graded composition of the second semiconductor region produces carrier confinement in the second semiconductor region.

6. The semiconductor device of claim 1, wherein the semiconductor device comprises a transistor.

7. The semiconductor device of claim 6, further comprising a source, a drain, and a gate over the second semiconductor region.

8. The semiconductor device of claim 7, wherein the source and the drain are in contact with the second semiconductor region.

9. The semiconductor device of claim 1, wherein the first side of the second semiconductor region is in contact with the first semiconductor region.

10. A transistor, comprising:
    a semiconductor region having a graded channel, the semiconductor region having a graded composition that is graded from AlN to a composition of $B_w Al_x In_y Ga_z N$ in which $w+x+y+z=1$, wherein w is greater than or equal to zero, x is greater than or equal to 0.3, y is greater than or equal to zero, and z is greater than or equal to 0, wherein the graded composition has a polarization gradient that confines carriers in the graded channel.

11. The transistor of claim 10, wherein x is at least 0.7.

12. The transistor of claim 10, wherein the semiconductor region is a first semiconductor region and the transistor further comprises:
   a second semiconductor region, wherein the first semiconductor region is formed over the second semiconductor region.

13. The transistor of claim 12, wherein the second semiconductor region comprises an AlN region.

14. The transistor of claim 13, wherein the AlN region comprises an AlN substrate or the AlN region is formed over an AlN substrate.

15. The transistor of claim 10, further comprising a source, a drain, and a gate over the semiconductor region.

16. The transistor of claim 15, wherein the source and the drain are in contact with the semiconductor region.

\* \* \* \* \*